United States Patent
Bai et al.

(10) Patent No.: US 10,268,866 B2
(45) Date of Patent: Apr. 23, 2019

(54) ULTRASONIC PROBE AND MANUFACTURING METHOD OF THE SAME AND ULTRASONIC FINGERPRINT RECOGNITION DEVICE

(71) Applicant: NANCHANG O-FILM BIO-IDENTIFICATION TECHNOLOGY CO., LTD., Nanchang (CN)

(72) Inventors: Anpeng Bai, Nanchang (CN); Wensi Sun, Nanchang (CN)

(73) Assignee: NANCHANG O-FILM BIO-IDENTIFICATION TECHNOLOGY CO., LTD., Nanchang (CN)

( * ) Notice: Subject to any disclaimer, the term of this patent is extended or adjusted under 35 U.S.C. 154(b) by 42 days.

(21) Appl. No.: 15/489,906

(22) Filed: Apr. 18, 2017

(65) Prior Publication Data
US 2018/0068152 A1  Mar. 8, 2018

(30) Foreign Application Priority Data

Sep. 5, 2016 (CN) .......................... 2016 1 0802615
Sep. 5, 2016 (CN) ...................... 2016 2 1037955 U

(51) Int. Cl.
| | | |
|---|---|---|
| G06K 9/28 | (2006.01) |
| G06K 9/00 | (2006.01) |
| H01L 41/25 | (2013.01) |
| H01L 41/113 | (2006.01) |
| H01L 41/187 | (2006.01) |
| B06B 1/06 | (2006.01) |

(52) U.S. Cl.
CPC .......... *G06K 9/0002* (2013.01); *B06B 1/0622* (2013.01); *H01L 41/1132* (2013.01); *H01L 41/1876* (2013.01); *H01L 41/25* (2013.01)

(58) Field of Classification Search
CPC .................................................. G06K 9/0002
See application file for complete search history.

(56) References Cited

U.S. PATENT DOCUMENTS

| | | | |
|---|---|---|---|
| 7,489,066 B2* | 2/2009 | Scott .................... | G06K 9/0002 310/325 |
| 2009/0279745 A1* | 11/2009 | Liautaud ............ | G06K 9/00026 382/116 |
| 2013/0270967 A1* | 10/2013 | Dausch ................ | B06B 1/0607 310/365 |
| 2014/0219521 A1* | 8/2014 | Schmitt ................ | G06K 9/0002 382/124 |

* cited by examiner

*Primary Examiner* — Brian Werner
(74) *Attorney, Agent, or Firm* — Hodgson Russ LLP

(57) ABSTRACT

The present disclosure provides an ultrasonic probe. The ultrasonic probe includes a piezoelectric layer, including a number of piezoelectric posts arranged in a number of rows along a first direction and arranged in a number of columns along a second direction, and an angle between the first direction and the second direction being an acute angle, a distance between the two adjacent piezoelectric posts along the first direction being greater than a distance between the two adjacent rows of the piezoelectric posts. The ultrasonic probe improves the density of the piezoelectric post by misaligning the two adjacent rows of piezoelectric posts and compressing the row spacing, which makes better use of the space between the two adjacent rows of piezoelectric posts. That is, the space utilization of the ultrasonic probe is improved and pixel density is high.

18 Claims, 5 Drawing Sheets

ULTRASONIC PROBE AND MANUFACTURING METHOD OF THE SAME AND ULTRASONIC FINGERPRINT RECOGNITION DEVICE

CROSS-REFERENCE TO RELATED APPLICATION

This application claims priority to and the benefit of Chinese Patent Application No. 201610802615.5, and 201621037955.5, both filed with the State Intellectual Property Office of P. R. China on Sep. 5, 2016. The entire contents of the above-identified application are incorporated herein by reference.

FIELD

The present disclosure relates to the field of ultrasonic fingerprint recognition, and more particularly, to an ultrasonic probe and a manufacturing method of the same and an ultrasonic fingerprint recognition device.

BACKGROUND

In the related art, the ultrasonic probe includes a piezoelectric layer. The piezoelectric layer includes a number of piezoelectric posts. The piezoelectric post serves as a pixel of the ultrasonic probe. The piezoelectric post is used for emitting and receiving the ultrasonic signal to obtain the corresponding pixel value. The piezoelectric posts are usually arranged in a right array, thus resulting in low space utilization and low pixel density.

SUMMARY

The present disclosure seeks to solve at least one of the problems existing in the related art to at least some extent. Embodiments of the present disclosure provide an ultrasonic probe and a manufacturing method of the same and an ultrasonic fingerprint recognition device.

An ultrasonic probe, according to the embodiment of the present disclosure, includes:

a piezoelectric layer, including a number of piezoelectric posts arranged in a number of rows along a first direction and arranged in a number of columns along a second direction, and an angle between the first direction and the second direction being an acute angle, a distance between the two adjacent piezoelectric posts along the first direction being greater than a distance between the two adjacent rows of the piezoelectric posts.

In some embodiments, the cross-section of the piezoelectric post is circular shape or rectangular shape.

In some embodiments, when the cross-section of the piezoelectric post is rectangular shape, the side of rectangle is perpendicular to or parallel to the second direction.

In some embodiments, the height of the piezoelectric post is 70 to 80 microns.

In some embodiments, the piezoelectric post includes lead zirconate titanate piezoelectric material.

In some embodiments, the piezoelectric layer includes a filler material arranged in gaps between sides of the piezoelectric posts.

In some embodiments, the filler material includes an epoxy resin.

In some embodiments, the ultrasonic probe includes:

a number of emitting lines arranged below the number of piezoelectric posts, each emitting line being connected to one row of the piezoelectric posts along the first direction; and a number of receiving lines arranged above the piezoelectric posts, each receiving line being connected to one column of the piezoelectric posts along the second direction.

In some embodiments, the ultrasonic probe includes:

a lower protective layer arranged below the emitting lines;

an upper protective layer arranged above the receiving lines.

An ultrasonic fingerprint recognition device, according to the embodiment of the present disclosure includes the ultrasonic probe. The ultrasonic probe includes:

a piezoelectric layer, including a number of piezoelectric posts arranged in a number of rows along a first direction and arranged in a number of columns along a second direction, and an angle between the first direction and the second direction being an acute angle, a distance between the two adjacent piezoelectric posts along the first direction being greater than a distance between the two adjacent rows of the piezoelectric posts.

In some embodiments, the cross-section of the piezoelectric post is circular shape or rectangular shape.

In some embodiments, when the cross-section of the piezoelectric post is rectangular shape, the side of rectangle is perpendicular to or parallel to the second direction.

In some embodiments, the height of the piezoelectric post is 70 to 80 microns.

In some embodiments, the piezoelectric post includes lead zirconate titanate piezoelectric material.

In some embodiments, the piezoelectric layer includes a filler material arranged in gaps between sides of the piezoelectric posts.

In some embodiments, the filler material includes an epoxy resin.

In some embodiments, the ultrasonic probe includes:

a number of emitting lines arranged below the piezoelectric posts, each emitting line being connected to one row of the piezoelectric posts along the first direction; and a number of receiving lines arranged above the piezoelectric posts, each receiving line being connected to one column of the piezoelectric posts along the second direction.

In some embodiments, the ultrasonic probe includes:

a lower protective layer arranged below the emitting lines;

an upper protective layer arranged above the receiving lines.

A manufacturing method of an ultrasonic fingerprint recognition device, according to the embodiment of the present disclosure, includes steps of:

providing a number of piezoelectric posts, the piezoelectric posts spacedly arranged in a number of rows along a first direction and spacedly arranged in a number of columns along a second direction, and an angle between the first direction and the second direction being an acute angle, a distance between the two adjacent piezoelectric posts along the first direction being greater than a distance between the two adjacent rows of the piezoelectric posts;

filling a filler material into gaps between sides of the piezoelectric posts to fix the piezoelectric posts.

In some embodiments, the method further includes steps of:

forming a number of emitting lines below the piezoelectric posts, each emitting line being connected to one row of the piezoelectric posts along the first direction; and forming a number of receiving lines above the piezoelectric posts, each receiving line being connected to one column of the piezoelectric posts along the second direction.

In some embodiments, the method further includes steps of:

forming a lower protective layer below the number of emitting lines;

forming an upper protective layer above the number of receiving lines.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
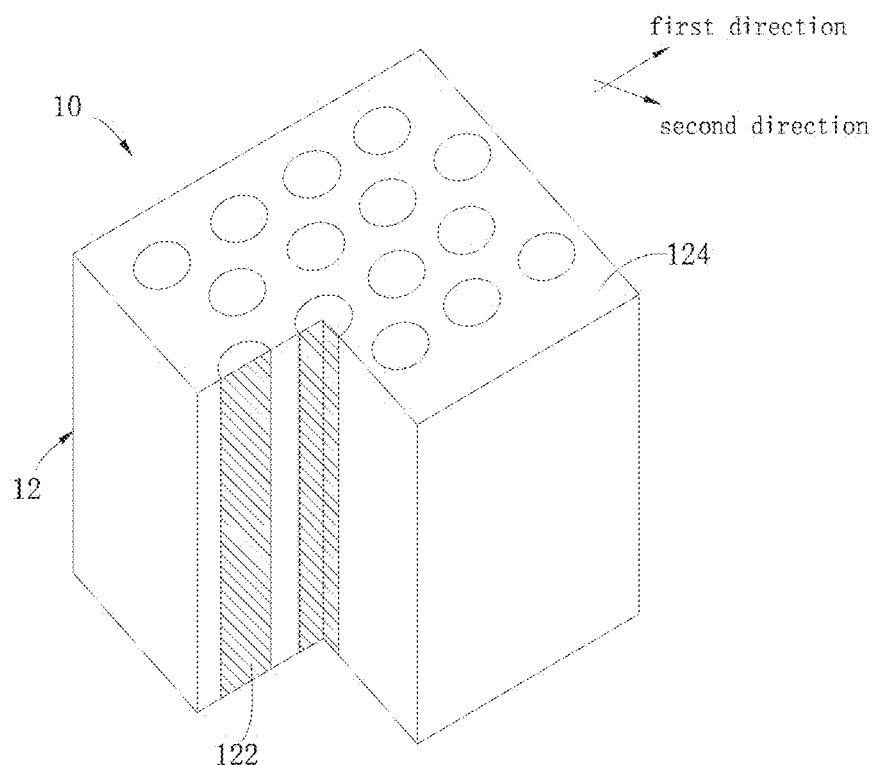
FIG. 1 is a cut-away view of an ultrasonic probe according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, it should be understood that the terms such as "central", "longitudinal", "lateral", "width", "thickness", "above", "below", "front", "rear", "right", "left", "vertical", "horizontal", "top", "bottom", "inner", "outer", "clockwise", "counter-clockwise" should be construed to refer to the orientation as then described or as shown in the drawings. These terms are merely for convenience and concision of description and do not alone indicate or imply that the device or element referred to must have a particular orientation. Thus, it cannot be understood to limit the present disclosure.

In addition, terms such as "first" and "second" are used herein for purposes of description and are not intended to indicate or imply relative importance or significance or impliedly indicate quantity of the technical feature referred to. Thus, the feature formed with "first" and "second" may comprise one or more of these features. In the description of the present disclosure, "a plurality of" and "a number of" means two or more than two of these features, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Please referring to FIG. 1, the ultrasonic probe 10 includes a piezoelectric layer 12. The piezoelectric layer 12 includes a number of piezoelectric posts 122. The piezoelectric posts 122 are arranged in a number of rows along a first direction and arranged in a number of columns along a second direction. An angle between the first direction and the second direction is an acute angle. A distance between the two adjacent piezoelectric posts 122 along the first direction is greater than a distance between the two adjacent rows of the piezoelectric posts 122.

Figure 2:
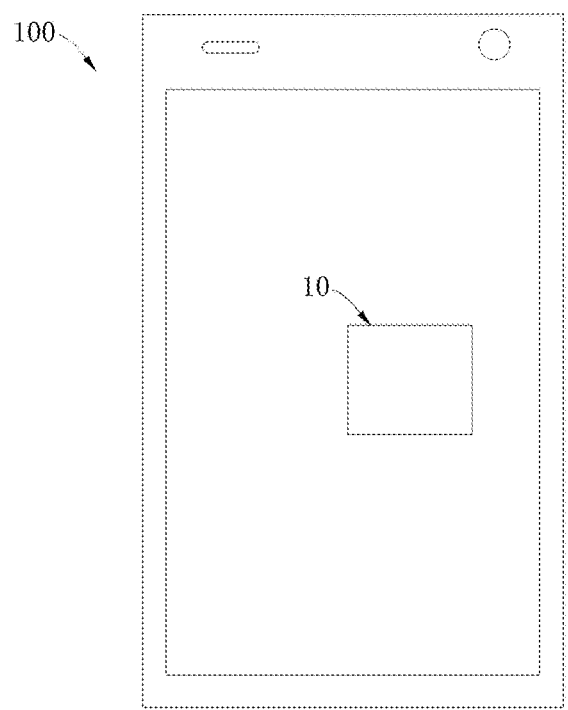
FIG. 2 is a plan view of an ultrasonic fingerprint recognition device according to an embodiment of the present disclosure.

Referring to FIG. 2, an ultrasonic fingerprint recognition device 100, according to the embodiment of the present disclosure, includes an ultrasonic probe 10. The ultrasonic probe 10 can be built into an ultrasonic fingerprint recognition device 100. In some embodiments, the ultrasonic fingerprint recognition device 100 may be an electronic equipment such as a mobile phone, a tablet computer, etc.

The ultrasonic probe 10 improves the density of the piezoelectric post 122 by misaligning the two adjacent rows of piezoelectric posts 122 and compressing the row spacing, which makes better use of the space between the two adjacent rows of piezoelectric posts 122. That is, the space utilization of the ultrasonic probe 10 is improved and pixel density is high.

It is noted that, in the embodiment of the present disclosure, the angle between the first direction and the second direction being an acute angle means that the smaller angle between the intersections of the two directions or between the two lines is an acute angle, or the first direction and the second direction are not perpendicular to each other.

In some embodiments, the piezoelectric layer 12 includes a filler material 124, and the filler material 124 is arranged in the gaps between sides of the piezoelectric posts 122.

Therefore, the filler material 124 can be used to fix the positions of the piezoelectric posts 122 so that the piezoelectric posts 122 do not shift and the structure of the piezoelectric layer 12 is more stable. It is to be understood that, the filler material 124 can be served as the substrate.

In particular, the method of arranging the piezoelectric posts 122 according to the embodiment of the present disclosure being advantageous in that the principle of improving the space utilization is explained with following descriptions in comparison with the method of arranging the piezoelectric posts in the right array.

It is to be understood that, in order to prevent the interference of the ultrasonic signals emitted or received by the adjacent piezoelectric posts 122 during the detection process, and to prevent short-circuiting the connection between the electrodes of the adjacent piezoelectric posts 122 caused by too smaller distance between the electrodes of the adjacent piezoelectric posts 122, when the piezoelectric posts 122 are arranged, it is necessary to provide a safety distance between the adjacent piezoelectric posts 122.

Figure 3:
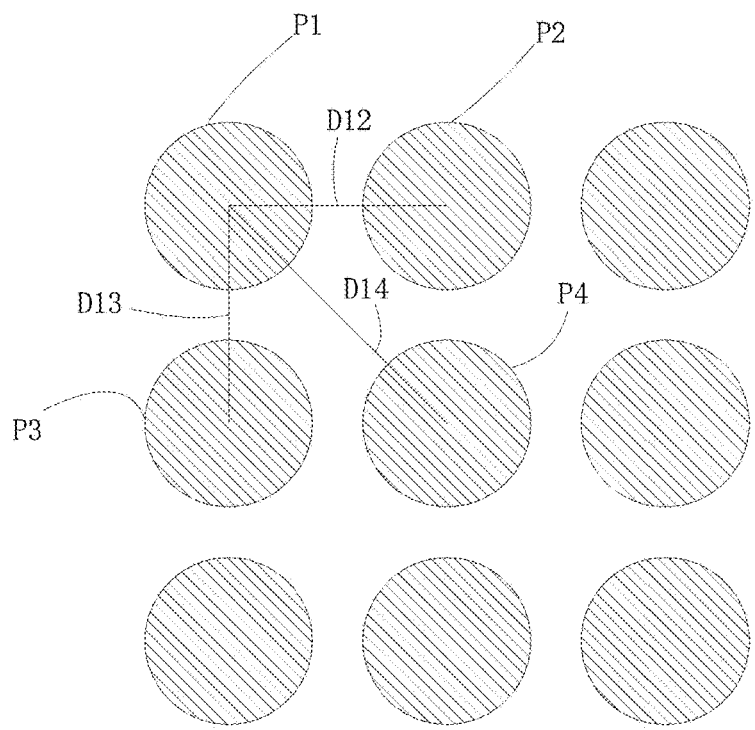
FIG. 3 is a schematic view showing the arrangement of the piezoelectric posts of an ultrasonic probe according to the related art.

Referring to FIG. 3, the conventional piezoelectric posts 122 are arranged in a right array, the distance between the piezoelectric post P1 and the piezoelectric post P2 is D12, the distance between the piezoelectric post P1 and the piezoelectric post P3 is D13, and the distance between the piezoelectric post P1 the piezoelectric post P4 is D14.

D14 is greater than D12 and D13 and greater than the desired value, D14 is too large and the space utilization of the piezoelectric layer 12 is not high if D12 is equal to D13 and equal to the desired value by adjusting the distances between the rows and columns of the piezoelectric posts 122. If D14 is adjusted to be the desired value, D12 and D13 are too small at this time, which may cause D12 and D13 to be smaller than the safety distance and affect the normal detection of the ultrasonic probe 10.

Figure 4:
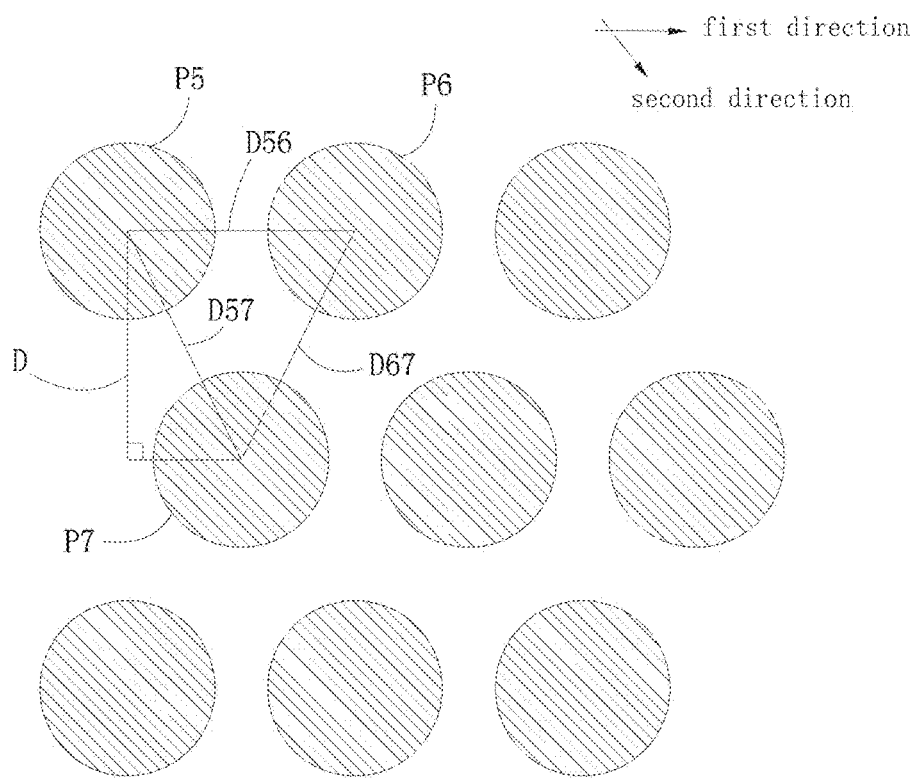
FIG. 4 is a schematic view showing the arrangement of the piezoelectric posts of an ultrasonic probe according to an embodiment of the present disclosure.

Referring to FIG. 4, in the embodiment of the present disclosure, the piezoelectric posts 122 are arranged in a number of rows along a first direction and are arranged in a number of columns along a second direction, and the angle between the first direction and the second direction is an acute angle. The distance between two adjacent piezoelectric posts 122 along the first direction is greater than the distance between two adjacent rows of piezoelectric posts 122.

Specifically, the piezoelectric post P5 and the piezoelectric post P6 are arranged in the same row and the distance is D56. The piezoelectric post P5 and the piezoelectric post P7 are arranged in two adjacent rows respectively and the distance is D57. The piezoelectric post P6 and the piezoelectric post P7 are arranged in two adjacent rows respectively and the distance is D67. Row spacing between the row of the piezoelectric post P5 and the piezoelectric post P6 and the row of the piezoelectric post P7 is D.

It is to be understood that, D56 can be set to the desired value and D57 can be made equal to D67 by moving the piezoelectric post P7 along the first direction. At this time, if D is set to be equal to D56, then D57 is larger than D56 by the Pythagorean theorem, that is, if D57 is greater than the desired value, then the space utilization of the piezoelectric layer 12 is insufficient. However, in the embodiment of the present disclosure, the distance between two adjacent piezoelectric posts 122 along the first direction is greater than the distance between two adjacent rows of piezoelectric posts 122, i.e., D is set to be smaller than D56, and as D decreases, D57 and D67 also decreases, which makes the piezoelectric posts 122 arranged compactly, and the space utilization of the piezoelectric layer 12 is improved.

Alternatively, the value of D may be set such that D57 is equal to D67 and equal to D56, that is, the distances of all adjacent piezoelectric posts 122 are the desired value, so that the arrangement of the piezoelectric posts 122 looks good and the space utilization of the piezoelectric layer 12 is high. In FIG. 4, the piezoelectric post P5, the piezoelectric post P6 and the piezoelectric post P7 are arranged in an equilateral-triangle form.

It is noted that, in the above discussions, the distance between the two piezoelectric posts 122 refers to the distance between the centers of the two piezoelectric posts 122. If the distance between the boundaries of the two piezoelectric posts 122 is regarded as the distance between the two piezoelectric posts 122, results similar to those of the above discussions can be obtained, and detailed descriptions are omitted here.

Alternatively, in some examples, to satisfy that the sampling resolution of the ultrasonic probe 10 is greater than pre-set value, such as greater than 508 DPI (Dots per Inch, the number of dots printed per inch), the gap between the piezoelectric posts 122 can be 50 microns. When the gap is greater than 50 microns, the sampling resolution will be reduced and the emitted or received ultrasonic signal will become weak, causing the ultrasonic fingerprint recognition device 100 to not accurately recognize the fingerprint.

In the embodiment of the present disclosure, the shapes of all the piezoelectric posts 122 are the same.

In this way, it is convenient to mass-produce the piezoelectric posts 122. Therefore, the cost of manufacturing the ultrasonic probe 10 can be saved. It is easier to arrange the piezoelectric posts 122, and control the distance between the piezoelectric posts 122.

In some embodiments, the piezoelectric posts 122 are in a straight-column shape.

Therefore, the piezoelectric post 122 is easily held in an upright state, and is not easy to be inclined, and the direction is easily determined when the piezoelectric post 122 emits the ultrasonic signal.

Referring to FIG. 1, in some embodiments, the cross-section of the piezoelectric post 122 is circular shape.

Therefore, the piezoelectric post 122 has a cylindrical shape, and the piezoelectric posts 122 are easily arranged and manufactured.

Figure 5:
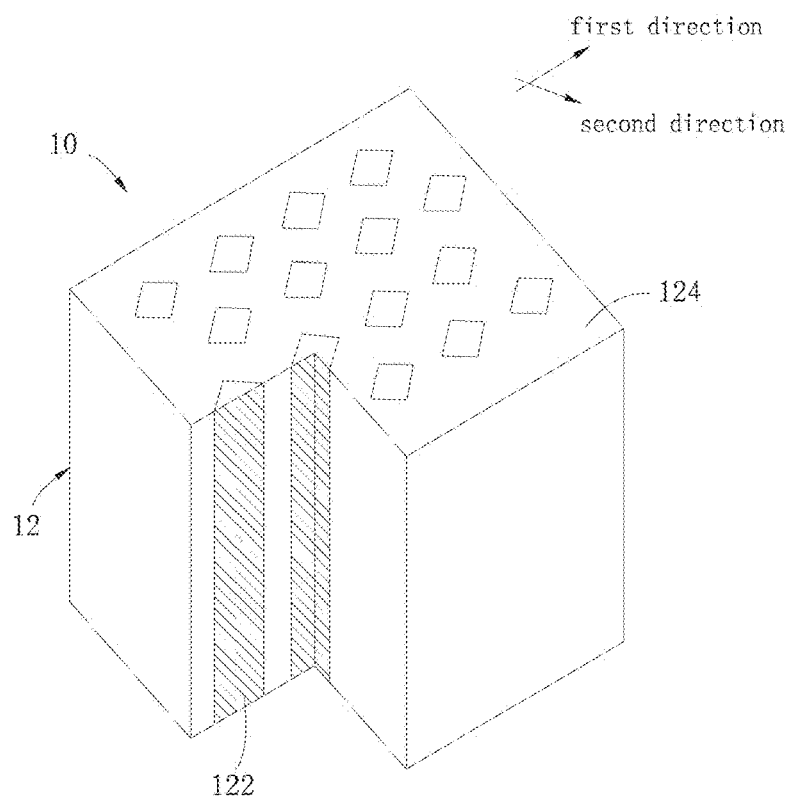
FIG. 5 is cut-away view of an ultrasonic probe according to an embodiment of the present disclosure.

Referring to FIG. 5, in some embodiments, the cross-section of the piezoelectric post 122 is rectangular shape and the side of rectangle is perpendicular to or parallel to the second direction.

Therefore, the piezoelectric post 122 is a cuboid and is easily arranged and manufactured.

In some embodiments, the height of the piezoelectric post 122 is 70-80 microns.

Therefore, the piezoelectric post 122 has a suitable capacitance, and it is easy to control the piezoelectric post 122 to emit or receive the ultrasonic signal.

In some embodiments, the piezoelectric post 122 includes lead zirconate titanate piezoelectric material.

The lead zirconate titanate piezoelectric material is a polycrystalline made by sintering zirconium dioxide, lead zirconate, and lead titanate at 1200-degree high temperature. The lead zirconate titanate piezoelectric material has positive piezoelectric effect and inverse piezoelectric effect. Therefore, the piezoelectric post 122 can receive the ultrasonic signal using a positive piezoelectric effect and emit the ultrasonic signal using the inverse piezoelectric effect.

Positive piezoelectric effect means that when the piezoelectric material is subjected to a certain direction of external force, the internal of the piezoelectric material will show the phenomenon of polarization. Charge with opposite sign is generated on two opposite surfaces of the piezoelectric material respectively. When the external force is removed, the piezoelectric material is back to no charge status.

Figure 6:
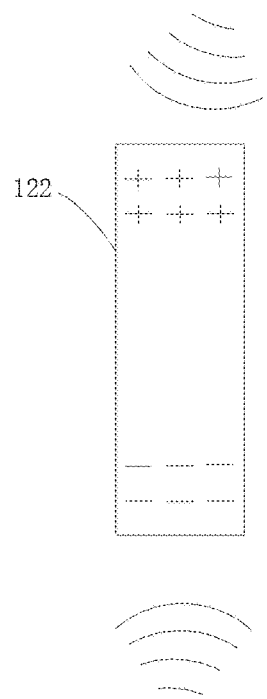
FIG. 6 is a schematic view showing a principle of a piezoelectric post receiving ultrasonic waves according to an embodiment of the present disclosure.

Referring to FIG. 6, in the embodiment of the present disclosure, the piezoelectric post 122 is deformed by the force of the ultrasonic signal applied to the piezoelectric post 122, thereby obtaining the potential difference information on the surface of the piezoelectric post 122. The potential difference information can then be shown in the form of an image by means of an amplifier and an analog-to-digital converter.

The inverse piezoelectric effect refers to the phenomenon that an alternating electric field is applied to the piezoelectric material to cause mechanical deformation of the piezoelectric material.

Figure 7:
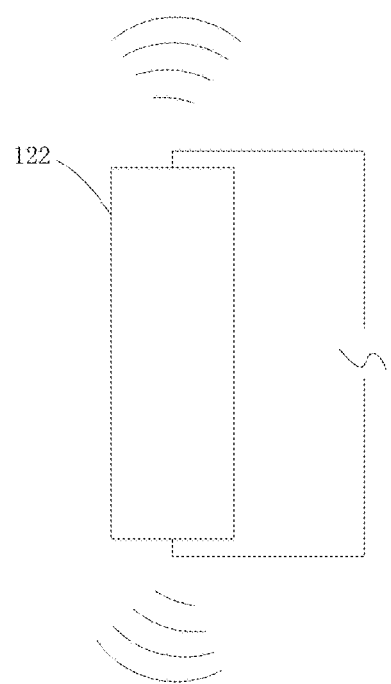
FIG. 7 is a schematic view showing a principle of a piezoelectric post emitting ultrasonic waves according to an embodiment of the present disclosure.

Referring to FIG. 7, in the embodiment of the present disclosure, the piezoelectric post 122 generates mechanical vibration by receiving an alternating voltage. The frequency of the mechanical vibration is controlled by adjusting the oscillation frequency of the alternating voltage, thereby causing the piezoelectric post 122 to emit the ultrasonic signal.

In some embodiments, the filler material 124 includes an epoxy resin.

The cured epoxy resin has good physical and chemical properties. It has excellent bonding strength to the surface of metal and nonmetallic materials, good dielectric properties, small deformation shrinkage, good dimensional stability, high hardness and good flexibility.

Therefore, the filler material 124 can effectively fix the positions of the piezoelectric posts 122 so that the structure of the piezoelectric layer 12 is more stable.

In one embodiment, in order to produce the piezoelectric layer 12 including piezoelectric posts 122 having a rectangular cross-section, the piezoelectric layer 12 may be obtained by cutting a block-like piezoelectric material. For example, the block-like piezoelectric material is cuboid-like piezoelectric material. The piezoelectric material can be lead zirconate titanate piezoelectric ceramics. Specifically, the piezoelectric posts 122 may be formed by cutting the piezoelectric material at a predetermined depth along a third direction and along a fourth direction by a cutting device having a predetermined width multiple times. In some embodiments, the third direction is perpendicular to the fourth direction.

In the embodiment of the present disclosure, the predetermined depth is the height of the piezoelectric post 122, and the width of gap between the piezoelectric posts 122 can be adjusted by arranging the piezoelectric posts 122. The height of the piezoelectric post 122 and the width of gap between the piezoelectric posts 122 can be selected according to the actual design requirements and the process requirements. In addition, the gap between the piezoelectric posts 122 is filled with the filler material 124, for example, an epoxy resin.

In another embodiment, the piezoelectric layer 12 may be formed by etching predetermined positions of the filler material 124 to form cylindrical through holes and filling the through hole with the piezoelectric material having a predetermined shape corresponding to the shape of the through hole. The filler material 124 may be an epoxy resin and the piezoelectric material may be lead zirconate titanate. The piezoelectric material filled in the through hole is used as the piezoelectric post 122. By etching the different shapes of cylindrical through holes, they can be used to fill piezoelectric posts 122 having different cross-sectional shapes, such as rectangular or circular in cross-sectional shape.

In still another embodiment, the piezoelectric layer 12 may be formed by etching predetermined positions of the filler material 124 to form cylindrical through holes and filling the though hole with the piezoelectric material. The filler material 124 may be an epoxy resin and the piezoelectric material may be lead zirconate titanate. The piezoelectric material filled in the through hole is used as the piezoelectric post 122. By etching the different shapes of cylindrical through holes, the piezoelectric posts 122 having different cross-sectional shapes, such as rectangular or circular in cross-sectional shape can be obtained.

It is to be understood that, in other embodiments, the specific manufacturing methods of the piezoelectric layer 12 may be different, and are not limited to the above discussions.

Figure 8:
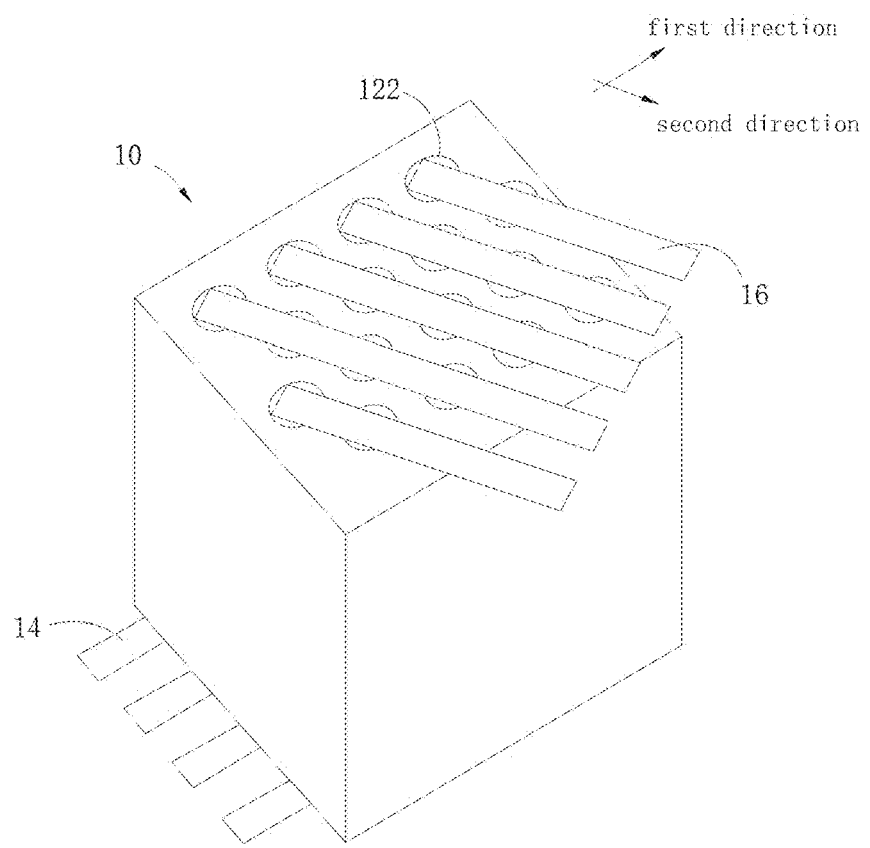
FIG. 8 is a schematic view of an ultrasonic probe according to an embodiment of the present disclosure.

Referring to FIG. 8, in some embodiments, the ultrasonic probe 10 includes a number of emitting lines 14 and a number of receiving lines 16.

The emitting lines 14 are arranged below the piezoelectric posts 122, and each emitting line 14 is connected to one row of the piezoelectric posts 122 along the first direction.

The receiving lines 16 are arranged above the piezoelectric posts 122, and each receiving line 16 is connected to one column of the piezoelectric posts 122 along the second direction.

It is noted that the connection between the emitting line 14 and the piezoelectric post 122, and the connection between the receiving line 16 and the piezoelectric post 122 are electrical connections. That is, the emitting line 14 and the piezoelectric post 122 may not be in direct contact in space. Under this circumstance, the potential of the emitting line 14 can still affect the piezoelectric post 122. The connection between the receiving line 16 and the piezoelectric post 122 is similar with that between the emitting line 14 and the piezoelectric post 122.

Therefore, when the ultrasonic waves are to be emitted, all of the receiving lines 16 are grounded and an alternating voltage is applied to the emitting lines 14, causing the piezoelectric post 122 to undergo mechanical deformation to emit the ultrasonic waves.

When the ultrasonic waves are to be received, all of the emitting lines 14 are grounded and the piezoelectric posts 122 are deformed under the action of ultrasonic waves to generate the potential difference at different positions of the piezoelectric posts 122. The receiving lines 16 receive and output the potential difference information.

In addition, the emitting lines 14 are arranged along the first direction and the receiving line 16 are along the second direction so that the arrangements of the emitting line 14 and the receiving line 16 are easy. The emitting line 14 does not come into contact with two rows of piezoelectric posts 122 at the same time, and the receiving line 16 does not come into contact with the two columns of piezoelectric posts 122 at the same time.

In the embodiment of the present disclosure, the widths of all the emitting lines 14 are equal everywhere, and the widths of all the receiving lines 16 are equal everywhere. Therefore, the emitting line 14 and the receiving line 16 are uniform in size and easy to manufacture, thereby saving the manufacturing cost of the ultrasonic probe 10.

It is to be understood that, each of the emitting lines 14 is connected to each row of the piezoelectric posts 122 along a first direction, i.e., the emitting lines 14 are parallel to each other. Each of the receiving lines 16 are connected to each column of the piezoelectric posts 122 along the second direction, i.e., the receiving lines 16 are parallel to each other.

Therefore, it can be concluded that the angle between the front projection of the emitting line 14 on the plane of the receiving line 16 and the receiving line 16 is an acute angle, or that the angle between the front projection of the receiving line 16 on the plane of the emitting line 14 and the emitting line 14 is an acute angle.

In the embodiment of the present disclosure, the emitting line 14 is formed on the lower surface 1221 of the piezoelectric post 122, and the receiving line 16 is formed on the upper surface 1222 of the piezoelectric post 122.

Figure 9:
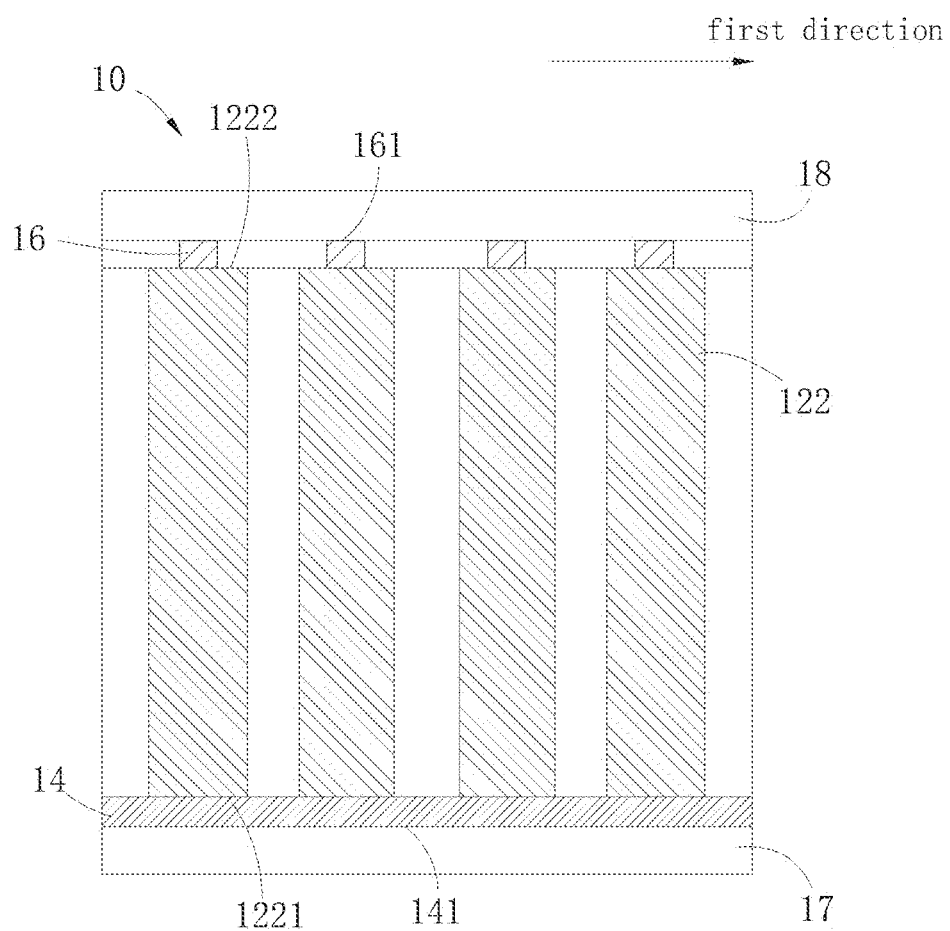
FIG. 9 is a plan view of an ultrasonic probe according to an embodiment of the present disclosure.

Referring to FIG. 9, in some embodiments, the ultrasonic probe 10 includes a lower protective layer 17 and an upper protective layer 18.

The lower protective layer 17 is arranged below the emitter lines 14. The upper protective layer 18 is arranged above the receiving lines 16.

Therefore, the upper protective layer 18 and the lower protective layer 17 can prevent dust or moisture from entering the ultrasonic probe 10. The upper protective layer 18 and the lower protective layer 17 make the structure of the ultrasonic probe 10 more stable.

In the embodiment of the present disclosure, the lower protective layer 17 is formed on the lower surface 141 of the receiving line 14, and the upper protective layer 18 is formed on the upper surface 161 of the receiving line 16.

A manufacturing method of an ultrasonic probe 10, according to the embodiment of the present disclosure, includes steps of:

providing a number of piezoelectric posts 122, the piezoelectric posts 122 spacedly arranged in a number of rows along a first direction and spacedly arranged in a number of columns along a second direction, and an angle between the first direction and the second direction being an acute angle, a distance between the two adjacent piezoelectric posts 122 along the first direction being greater than a distance between the two adjacent rows of the piezoelectric posts 122; and filling a filler material 124 into gaps between sides of the piezoelectric posts 122 to fix the piezoelectric posts 122.

It is noted that, the above detailed descriptions for the features and advantages of the ultrasonic probe 10 in embodiments of the present disclosure are suitable for the manufacturing method of an ultrasonic probe 10. Therefore, detailed descriptions for the manufacturing method of an ultrasonic probe 10 are omitted.

In some embodiments, the method further includes steps of:

forming a number of emitting lines 14 below the piezoelectric posts 122, each emitting line 14 being connected to one row of the piezoelectric posts 122 along the first direction; and forming a number of receiving lines 16 above the piezoelectric posts 122, each receiving line 16 being connected to one column of the piezoelectric posts 122 along the second direction.

In some embodiments, the method further includes steps of:

forming a lower protective layer 17 below the emitting lines 14; and forming an upper protective layer 18 above the receiving lines 16.

Reference throughout this specification to "an embodiment," "one embodiment," "another embodiment," "some embodiments," "an illustrated embodiment", "an example," "a specific example," or "some examples," means that a particular feature, structure, material, or characteristic described in connection with the embodiment or example is included in at least one embodiment or example of the present disclosure. The schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. An ultrasonic probe for use in an ultrasonic fingerprint recognition device, the ultrasonic probe comprising:
a piezoelectric layer, comprising a plurality of piezoelectric posts arranged in a plurality of rows along a first direction and arranged in a plurality of columns along a second direction, and an angle between the first direction and the second direction being an acute angle, a distance between the two adjacent piezoelectric posts along the first direction being greater than a distance between the two adjacent rows of the piezoelectric posts;
wherein the ultrasonic probe further comprises:
a plurality of emitting lines arranged below the plurality of piezoelectric posts, each emitting line being connected to one row of the piezoelectric posts along the first direction; and
a plurality of receiving lines arranged above the plurality of piezoelectric posts, each receiving line being connected to one column of the piezoelectric posts along the second direction.

2. The ultrasonic probe of claim 1, wherein the cross-section of the piezoelectric post is circular shape or rectangular shape.

3. The ultrasonic probe of claim 2, wherein when the cross-section of the piezoelectric post is rectangular shape, the side of rectangle is perpendicular to or parallel to the second direction.

4. The ultrasonic probe of claim 1, wherein the height of the piezoelectric post is 70 to 80 microns.

5. The ultrasonic probe of claim 1, wherein the piezoelectric post comprises lead zirconate titanate piezoelectric material.

6. The ultrasonic probe of claim 1, wherein the piezoelectric layer comprises a filler material arranged in gaps between sides of the plurality of piezoelectric posts.

7. The ultrasonic probe of claim 6, wherein the filler material comprises an epoxy resin.

8. The ultrasonic probe of claim 1, wherein the ultrasonic probe comprises:
a lower protective layer arranged below the plurality of emitting lines;
an upper protective layer arranged above the plurality of receiving lines.

9. An ultrasonic fingerprint recognition device comprising the ultrasonic probe, the ultrasonic probe comprising:
a piezoelectric layer, comprising a plurality of piezoelectric posts arranged in a plurality of rows along a first direction and arranged in a plurality of columns along a second direction, and an angle between the first direction and the second direction being an acute angle, a distance between the two adjacent piezoelectric posts along the first direction being greater than a distance between the two adjacent rows of the piezoelectric posts;

wherein the ultrasonic probe further comprises:

a plurality of emitting lines arranged below the plurality of piezoelectric posts, each emitting line being connected to one row of the piezoelectric posts along the first direction; and a plurality of receiving lines arranged above the plurality of piezoelectric posts, each receiving line being connected to one column of the piezoelectric posts along the second direction.

10. The ultrasonic fingerprint recognition device of claim 9, wherein the cross-section of the piezoelectric post is circular shape or rectangular shape.

11. The ultrasonic fingerprint recognition device of claim 10, wherein when the cross-section of the piezoelectric post is rectangular shape, the side of rectangle is perpendicular to or parallel to the second direction.

12. The ultrasonic fingerprint recognition device of claim 9, wherein the height of the piezoelectric post is 70 to 80 microns.

13. The ultrasonic fingerprint recognition device of claim 9, wherein the piezoelectric post comprises lead zirconate titanate piezoelectric material.

14. The ultrasonic fingerprint recognition device of claim 9, wherein the piezoelectric layer comprises a filler material arranged in gaps between sides of the plurality of piezoelectric posts.

15. The ultrasonic fingerprint recognition device of claim 14, wherein the filler material comprises an epoxy resin.

16. The ultrasonic fingerprint recognition device of claim 9, wherein the ultrasonic probe comprises:

a lower protective layer arranged below the plurality of emitting lines;

an upper protective layer arranged above the plurality of receiving lines.

17. A manufacturing method of an ultrasonic fingerprint recognition device, comprising steps of:

providing a plurality of piezoelectric posts, the piezoelectric posts spacedly arranged in a plurality of rows along a first direction and spacedly arranged in a plurality of columns along a second direction, and an angle between the first direction and the second direction being an acute angle, a distance between the two adjacent piezoelectric posts along the first direction being greater than a distance between the two adjacent rows of the piezoelectric posts; and filling a filler material into gaps between sides of the plurality of piezoelectric posts to fix the piezoelectric posts;

further comprising steps of:

forming a plurality of emitting lines below the plurality of piezoelectric posts, each emitting line being connected to one row of the piezoelectric posts along the first direction; and forming a plurality of receiving lines above the plurality of piezoelectric posts, each receiving line being connected to one column of the piezoelectric posts along the second direction.

18. The method of claim 17, further comprising steps of:

forming a lower protective layer below the plurality of emitting lines; and forming an upper protective layer above the plurality of receiving lines.

* * * * *